United States Patent [19]

Lau et al.

[11] Patent Number: 5,376,226
[45] Date of Patent: Dec. 27, 1994

[54] METHOD OF MAKING CONNECTOR FOR INTEGRATED CIRCUIT CHIPS

[75] Inventors: James C. K. Lau, Torrance; Richard P. Malmgren, Rancho Dominguez; Ronald A. DePace, Mission Viejo, all of Calif.

[73] Assignee: TRW Inc., Redondo Beach, Calif.

[21] Appl. No.: 10,235

[22] Filed: Jan. 28, 1993

[51] Int. Cl.$^5$ .......................... B44C 1/22; C23F 1/00
[52] U.S. Cl. ..................... 156/643; 156/651; 156/655; 156/656; 156/901; 29/876
[58] Field of Search ............... 156/631, 633, 634, 643, 156/644, 651, 655, 656, 659.1, 902, 901, 668; 29/852, 876; 439/55, 68, 74, 883, 886, 889, 908

[56] References Cited

U.S. PATENT DOCUMENTS 5,135,606  8/1992  Kato et al. ........................... 156/631
5,145,552  9/1992  Yoshizawa et al. ............. 156/644 X Primary Examiner—William Powell

[57] ABSTRACT

A connector is disclosed for electrically coupling groups of contact points formed on a first and second electronic circuit chip. The connector is constructed by applying a layer of dielectric material to a planar electrically conductive base, lithographically printing a pattern onto the dielectric material, etching the pattern and creating a plurality of wells extending through the dielectric material and a matching plurality of cavities in the surface of the base, and electroplating the pattern and filling the wells with an electrically conductive electroplate material. The electroplate thereby forms a plurality of conductive members, each extending through the dielectric material. The base is then removed from the dielectric material, thereby forming a connector board having the conductive members extending therethrough for electrically coupling the first and second groups of contact points on the circuit chips.

6 Claims, 4 Drawing Sheets

METHOD OF MAKING CONNECTOR FOR INTEGRATED CIRCUIT CHIPS

BACKGROUND OF THE INVENTION

1. Technical Field

This invention relates generally to a connector for electrically coupling integrated circuit chips, and more particularly to a lithographically manufactured connector for electrically coupling groups of contact points formed on integrated circuit chips.

2. Discussion

The computer industry has, and continues to, expend great effort on miniaturization. Integrated circuit chip technology has resulted in great advances in size reduction. It is desirable to implant the greatest possible number of electronic components on a specific amount of surface area on each integrated circuit chip.

One technique for increasing the number of electronic components in a given of surface area on a integrated circuit board is to stack a number of circuit boards or computer chips to make a three dimensional multichip module. Such a multichip array has been created by the use of a "button board," which is a connector board having through connections or "vias." Button boards have been constructed by forming a series of holes in an electrically insulating board, placing short wires through each of these holes, and physically deforming and crushing the ends of these wires, thereby creating a rivet-shaped electrically conducting connector between a contact point on one side of the button board and another contact point on the opposite side.

In accordance with the race for miniaturization, it is desirable to form three dimensional multichip arrays with very thin integrated circuit chips and connectors, so that more integrated circuit chips may be stacked in a given volume, to enable high density connections of integrated circuit chips. Button board connectors have been constructed having a thickness as small as 10 mil, or 0.010 inches, and having adjacent conductive members being separated by a distance as small as 10 mil, or 0.010 inches. It is therefore desirable to construct a connector for connecting stacked integrated circuit chips in a multichip array which may be formed as thin as possible to increase performance.

SUMMARY OF THE INVENTION

According to a preferred embodiment of the present invention, a connector is disclosed for electrically coupling groups of contact points formed on a first and second electronic integrated circuit chip. The connector is constructed by applying a layer of dielectric material to a planar electrically conductive base, lithographically printing an image of a pattern defining a plurality of pattern elements onto the dielectric material, etching the pattern and creating a plurality of wells extending through the dielectric material and a matching plurality of cavities in the surface of the base, and electroplating the pattern and filling the wells with an electrically conductive electroplate material. The electroplate thereby forms a plurality of conductive members, each extending through the dielectric material. The base is then removed from the dielectric material, thereby forming a connector having conductive members extending therethrough for electrically coupling the first and second groups of contact points on the integrated circuit chips.

The various advantages and features of the present invention will become apparent from the following description and claims in conjunction with the accompanying drawings:

DETAILED DESCRIPTION OF THE PREFERRED EMBODIMENTS

The following description of the preferred embodiments is merely exemplary in nature, and is in no way intended to limit the invention, or its application, or uses.

Figure 1:
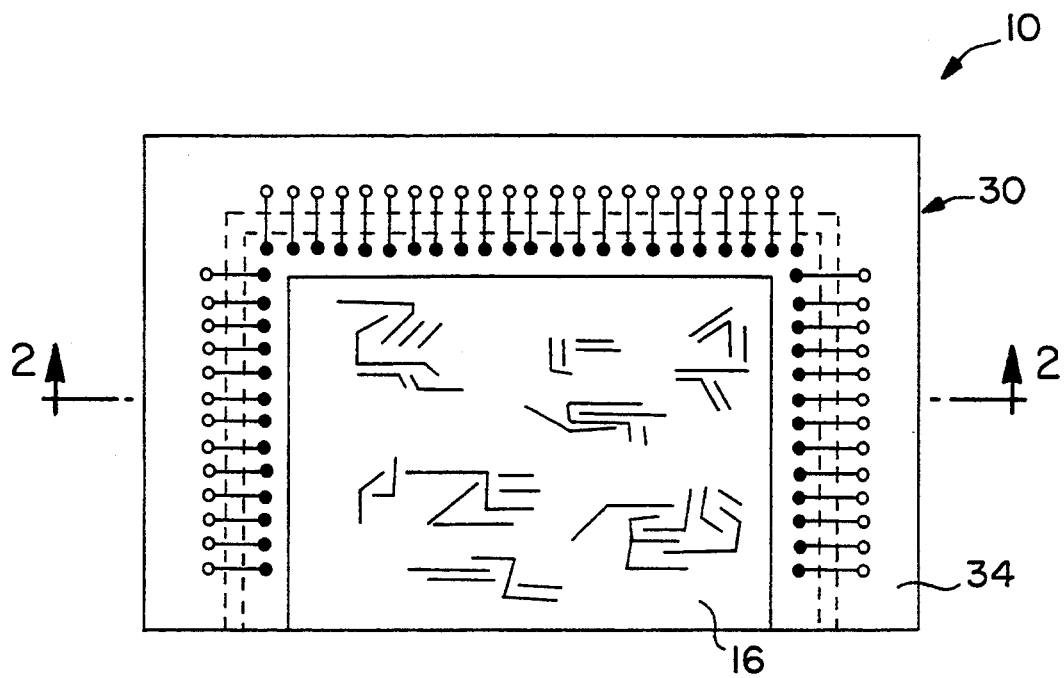
FIG. 1 is a top plan view of the connector of the present invention, assembled in an array with integrated circuit chips.
Figure 2:
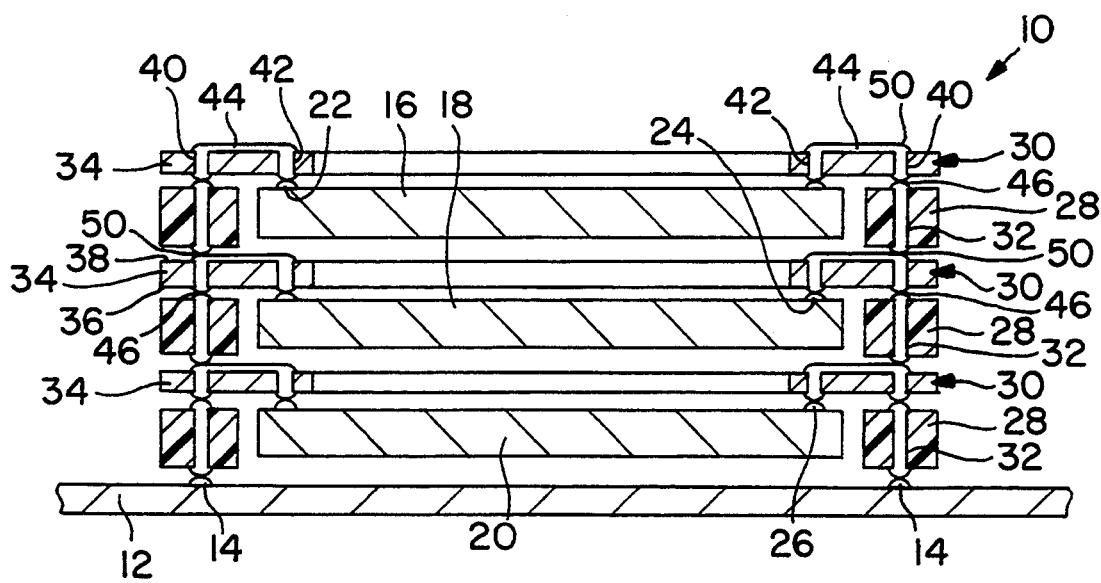
FIG. 2 is a sectional view taken along the line 2—2 in FIG. 1.
Figure 3:
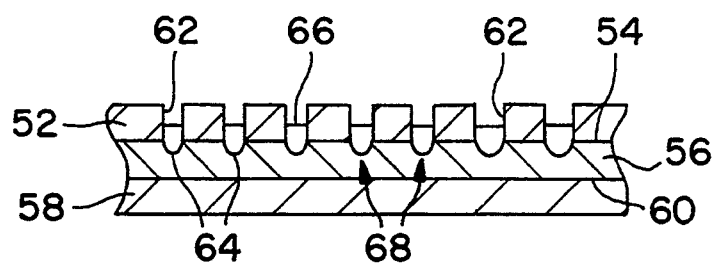
FIGS. 3–6 are a progressive series of views illustrating the method for constructing the connector of the present invention.
Figure 4:
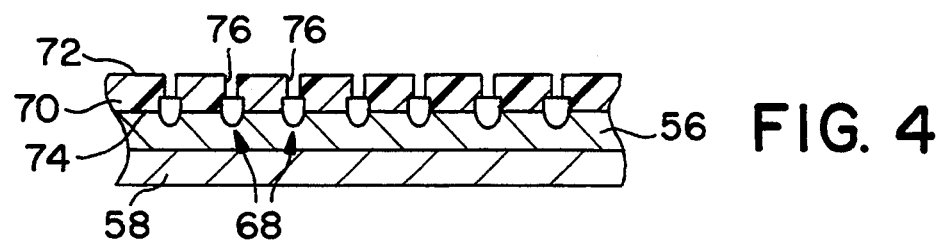
Figure 5:
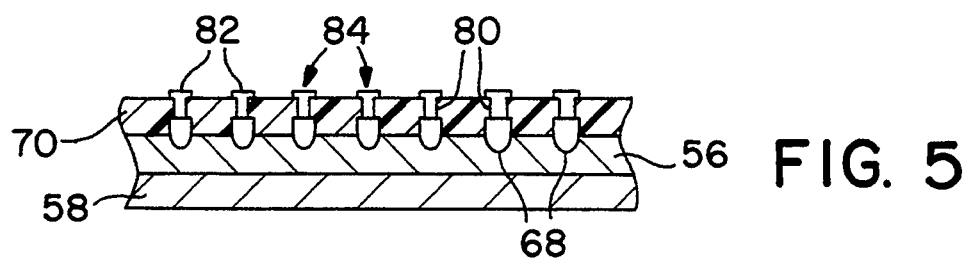
Figure 6:
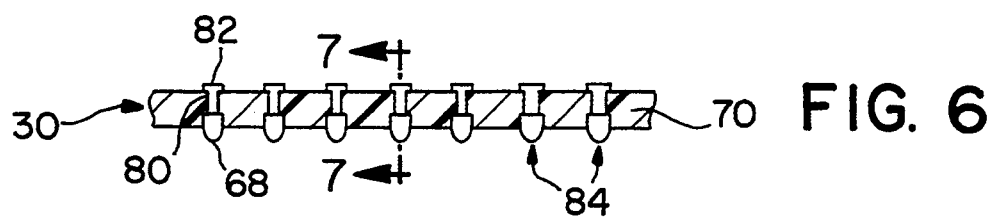
Figure 7:
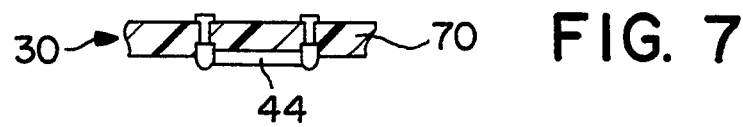
FIG. 7 is a sectional view of the connector of the present invention, taken along line 7—7 in FIG. 6.

With reference to the drawings, a stacked multichip array 10 is shown in FIGS. 1 and 2. Array 10 is formed on a base circuit board or "mother board" 12 having a plurality of base contact points 14 which are electrically coupled with other circuits and electronic components (not shown) formed on mother board 12. A first, second, and third integrated circuit chip, numbered 16, 18 and 20 respectively, are stacked on top of each other in array 10 and have a first, second, and third group of circuit chip contact points, numbered 22, 24, and 26 respectively, which may be electrically coupled with the group of base contact points 14 by a spacer 28 and the novel connector 30 of the present invention. Spacer 28 is generally formed of an electrically insulating dielectric material having a plurality of electrically conductive vias 32 extending therethrough, which may be formed according to the known button board or other filled-via technology.

The connector 30 of the present invention is formed of a connector board 34 formed of a dielectric material and having a first and second side 36 and 38, a first and second group of laterally spaced openings extending through connector board 34, a first and second group of electroplated conductive members 40 and 42 each extending through one of the first and second group of openings respectively, and a third group of conducting members 44 located on the second side 38 of connector board 34, each extending laterally from one of first group of conductive members 40 to one of second group of conductive members 42. The term board is used herein to denote any planar object, regardless of its thickness. The first and second groups of openings are lithographically formed through connector board 34 and are laterally spaced. Each electroplated conductive member in first and second groups 40 and 42 has an anchor portion 46 on the second side 38 of connector board 34. Each anchor 46 has a larger lateral dimension than its respective opening for resisting removal of conducting members 40 and 42. Each of the first and second group of conductive members 40 and 42 further has a via portion 48 extending from anchor 46 through the opening and expanding laterally onto the first side 36 of connector board 34 to form a head portion 50, each head portion 50 also having a lateral dimension larger than the corresponding opening for resisting removal of conducting members 40 and 42. Each of the third group of conducting members extends laterally from an anchor 46 formed on one of first group of conducting members 40 to an anchor 46 formed on one of the second group of conductive members 42. Each head portion 50 formed on the second group of conducting members 42 is arranged to align with and contact a circuit chip contact point 22, 24 or 26, and each head portion 50 formed on the first group of conducting members 40 is arranged to align with and contact a base contact point 14 or a contact point formed on via 32 of spacers 28.

In the embodiment shown in FIGS. 1 and 2, the novel connector 30 of the present invention allows many integrated circuit chips 16, 18 and 20 to be stacked in a single array 10 and provide electrical coupling between groups of contact points formed on integrated circuit chips 16, 18 and 20 and also to another group of contact points 14 formed on base circuit board 12. Connector 30 is formed lithographically and therefore can be made very thin.

One problem with miniaturization of electronic components is the unacceptable buildup of waste heat which must be transferred away from the electronic components. Circuit chips 16, 18, and 20 are generally rectangular, and connectors 30 and spacers 28 may be formed to extend along any number of the peripheral sides of circuit chips 16, 18, and 20. Preferably, connector 30 and spacers 28 are formed to extend along three of the edges of circuit chips 16, 18, and 20, as shown in FIGS. 1 and 2. As a result, the open fourth edges of integrated circuit chips 16, 18 and 20 are left open for heat transfer by forced or natural convection.

Connector 30 is manufactured according to the process of the present invention by applying a layer of photoresist 52 to a first side 54 of a planar electrically conductive base 56 having a layer of insulating material 58 on a second side 60 of base 56. An image of a first pattern is lithographically printed onto photoresist layer 52, thereby defining a plurality of first pattern elements (not shown). The first pattern is then etched, whereby photoresist layer 52 and a portion of base 56 are removed in the locations of the first pattern elements. This etching process thereby creates a plurality of wells 62 extending through photoresist layer 52 and a matching plurality of cavities in first surface 54 of base 56. The first pattern is then electroplated with an electrically conductive electroplate material 66, such that electroplate material 66 fills cavity 64, thereby forming a plurality of anchor portions 68. A variety of materials may be selected for electroplate material 66, such as for example copper, aluminum, silver, or gold. Photoresist layer 52 is then removed from base 56, leaving anchors 68 remaining on base 56. A layer of dielectric material 70 is applied to first side 54 of base 56, such that dielectric 70 covers first side 54 and anchors 68. Dielectric material 70 has a first and second side set, 70 and 74 respectively. An image of a second pattern is lithographically printed onto dielectric material 70, thereby defining a plurality of second pattern elements which are smaller than the first pattern elements. The second pattern is then etched, whereby dielectric material is removed in the locations of the second pattern elements, thereby creating a plurality of openings 76 extending through dielectric material 70 and leading to and exposing anchors 68. Openings 76 are laterally smaller than anchors 68. The second pattern is then electroplated with an electrically conductive electroplate material 78, which may be identical to electroplate 66, such that electroplate 78 fills openings 76 and forms a plurality of via portions 80 each extending from an anchor 68 through one of openings 76 and extending laterally onto the first side of dielectric material 70 to form a head portion 82 having a laterally dimension larger than opening 76. A plurality of conducting members 84 are thereby formed, each extending through dielectric material 70. Base 56 and attached insulating material 58 are removed from dielectric material 70, thereby forming connector 30.

Anchors 68 and head portions 82 resist removal of conducting members 84 from connector board 34 because they are laterally larger than the opening and via portion 80, and they cannot be pulled through the opening. In addition, the step of electroplating the first pattern may be formed such that electroplate material 66 fills cavity 64 and also a portion of wells 62, forming anchor 68 which extends into a recess formed in dielectric material 70, and more firmly affixing conducting member 84 in place in dielectric material 70.

It may be necessary to place a second layer of photoresist material 52 onto first side 72 of dielectric material 70 in order to lithographically print the image of the second pattern, in the event that the dielectric material 70 is not photoreactive.

Further, it may be necessary to deposit a very thin layer of conducting material (not shown) which can be selectively removed without damaging electroplate material 66, such as for example aluminum, onto first side 72 of the dielectric material 70 before placing second layer of photoresist material 52 on top of the thin layer of conducting material (not shown). The next step of etching the second pattern thereby removes the photoresist material 52 and the thin layer of conducting material (not shown), as well as dielectric material 70 in the locations of the second pattern elements. This step of etching thereby creates a plurality of openings extending through photoresist layer 52 and the thin layer of conducting material (not shown) and dielectric material 70. Finally, at the end of the process, the photoresist layer 52 and the thin layer of conducting material (not shown) are removed from dielectric material 70, thereby forming connector 30. Moreover, it may be necessary to perform this etching step by a process of "plasma etching" as known in the art, which is a more powerful process than conventional etching. By forming connector 30 with the novel process of the present invention, connector 30 may be formed having a thickness substantially within the range of 0.5 mil to 5 mil, or 0.005 inches to 0.0005 inches. In addition, each electroplated conductive member 84 of connector 30 may be lithographically formed to be very close to an adjacent electroplated conductive member 84 to enable additional miniaturization. Adjacent conductive members 84 may be separated only by a distance substantially within the range of 1 to 5 mil, or 0.001 to 0.005 inches.

Figure 9:
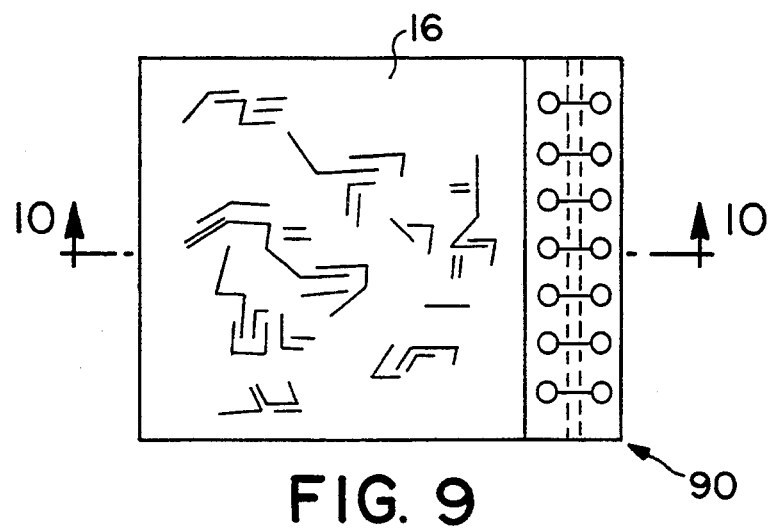
FIG. 9 is a plan view of another alternative embodiment of the present invention.
Figure 10:
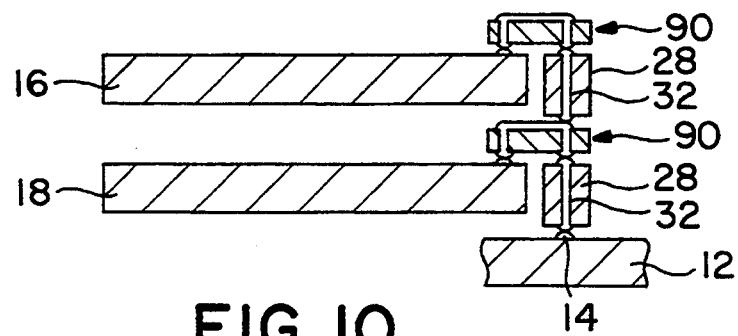
FIG. 10 is a sectional view, taken along line 10—10 in FIG. 9.

An alternative embodiment of the present invention is shown in FIGS. 9 and 10, in which identical reference numerals refer to similar elements. Connector 90 and spacer 28 are formed extending along only one edge of rectangular circuit chips 16 and 18. This construction allows for greater heat transfer away from circuit chips 16 and 18 by either forced or natural convection.

Figure 8:
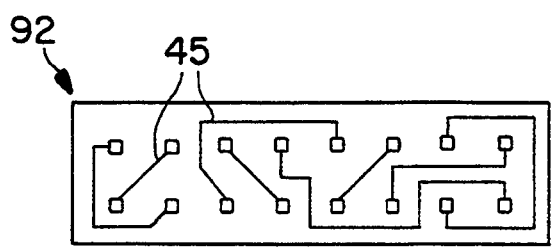
FIG. 8 is a top plan view of a connector arranged according to an alternative embodiment of the present invention.

As shown in FIG. 8, connector 92 may be formed having lateral connections 45 similar to connections 44 which do not simply connect mutually opposing conductive members 40 and 42. In other words, a certain amount of electrical "routing" may be formed directly onto connector 92.

Figure 11:
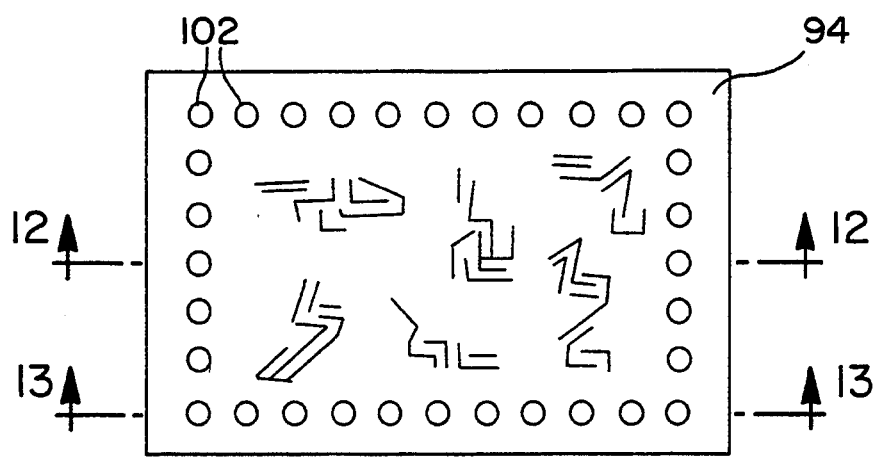
FIG. 11 is a plan view of yet another alternative embodiment of the present invention.
Figure 12:
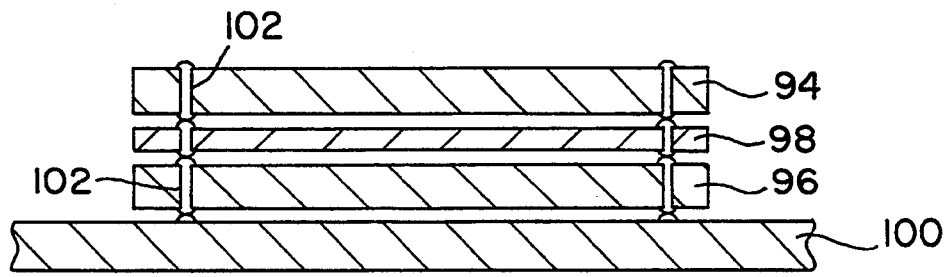
FIGS. 12 and 13 are sectional views, taken along lines 12—12 and 13—13, respectively, in FIG. 11.
Figure 13:
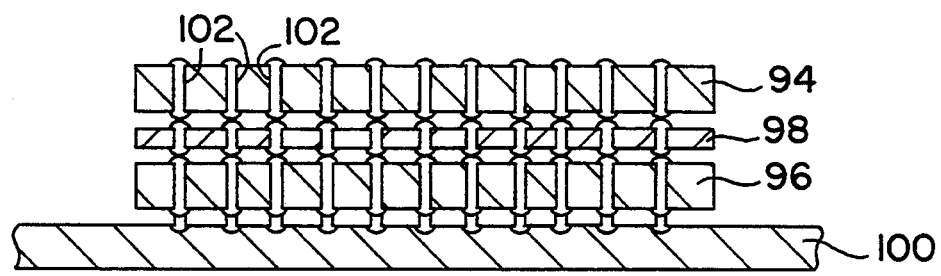

A third alternative embodiment of the present invention is shown in FIGS. 11 through 13, in which no spacer 28 is necessary. In this embodiment, integrated circuit chips 94 and 96 may be connected by connector 98 and also to base or mother board 100, but then circuit chips 94 and 96 must be formed with vias 102 extending therethrough, and the majority of integrated circuit chips are not constructed with such vias 102.

It should be understood that an unlimited number of configurations of the present invention can be realized. The foregoing discussion discloses and describes merely exemplary embodiments of the present invention. One skilled in the art will readily recognize from the discussion and from the accompanying drawings and claims that various changes and modifications can be made without departing from the spirit and scope of the invention, as defined in the following claims.

What is claimed is:

1. A method for manufacturing a connector for electrically coupling a first and second group of contact points formed on a first and second electronic circuit chip, respectively, comprising the steps of:

(a) applying a layer of photoresist to a first side of a planar electrically conductive base;
 (b) lithographically printing an image of a first pattern onto said photoresist layer, said pattern defining a plurality of first pattern elements;
 (c) etching said first pattern, whereby said photoresist and a portion of said base are removed in the locations of said first pattern elements, thereby creating a plurality of wells extending through said photoresist and a matching plurality of cavities in said first surface of said base;
 (d) electroplating said first pattern with an electrically conductive electroplate material, such that said electroplate material fills said cavities, thereby forming a plurality of anchor portions;
 (e) removing said photoresist from said base, said anchor portions remaining on said base;
 (f) applying a layer of dielectric material having first and second sides to said first side of said base, such that said dielectric material covers said first side of said base and said anchor portions;
 (g) lithographically printing an image of a second pattern onto said dielectric material, said second pattern defining a plurality of second pattern elements, said second pattern elements being smaller than said first pattern elements;
 (h) etching said second pattern, whereby said dielectric material is removed in the locations of said second pattern elements, thereby creating a plurality of openings extending through said dielectric material, said openings being smaller than said anchors;
 (i) electroplating said second pattern with an electrically conductive electroplate material, such that said electroplate material fills said openings and forms a plurality of via portions each extending from an anchor through one of said openings and extending laterally onto said first side of said dielectric material to form a head having a lateral dimension larger than said opening, thereby forming a plurality of conductive members each extending through said dielectric material; and
 (j) removing said base from said dielectric material, thereby forming said connector.

2. The method as set forth in claim 1, wherein said step (d) of electroplating said first pattern is performed such that said electroplate material fills said cavities and a portion of said wells.

3. A method for manufacturing a connector for electrically coupling a first and second group of contact points formed on a first and second electronic circuit chip, respectively, comprising the steps of:

(a) applying a layer of photoresist to a first side of a planar electrically conductive base;
 (b) lithographically printing an image of a first pattern onto said photoresist layer, said pattern defining a plurality of first pattern elements;
 (c) etching said first pattern, whereby said photoresist and a portion of said base are removed in the locations of said first pattern elements, thereby creating a plurality of wells extending through said photoresist and a matching plurality of cavities in said first surface of said base;
 (d) electroplating said first pattern with an electrically conductive electroplate material, such that said electroplate material fills said cavities, thereby forming a plurality of anchor portions;
 (e) removing said photoresist from said base, said anchor portions remaining on said base;
 (f) applying a layer of dielectric material having first and second sides to said first side of said base, such that said dielectric material covers said first side of said base and said anchor portions;
 (g) applying a second layer of photoresist to said first side of said dielectric material;
 (h) lithographically printing an image of a second pattern onto said second layer of photoresist, said second pattern defining a plurality of second pattern elements, said second pattern elements being smaller than said first pattern elements;
 (i) etching said second pattern, whereby said photoresist and dielectric material are removed in the locations of said second pattern elements, thereby creating a plurality of openings extending through said photoresist and dielectric material which are laterally smaller than said anchor portions;
 (j) removing said second layer of photoresist from said dielectric material;
 (k) electroplating said pattern with an electrically conductive electroplate material, such that said electroplate material fills said openings and forms a plurality of via portions each extending from an anchor through one of said openings and extending laterally onto said first side of said dielectric material to form a head having a lateral dimension larger than said opening, thereby forming a plurality of conductive members each extending through said dielectric material; and (1) removing said base from said dielectric material, thereby forming said connector.

4. The method as set forth in claim 3, wherein said step (d) of electroplating said first pattern is performed such that said electroplate material fills said cavities and a portion of said wells.

5. The method as set forth in claim 3, further comprising the step following said step (f) of:
 depositing a thin layer of conducting material onto said first side of said dielectric material;
 whereby said step (i) of etching said second pattern removes said photoresist and said thin layer of conducting material and said dielectric material in the locations of said second pattern elements and creates a plurality of openings extending through said photoresist and said thin layer of conducting material and said dielectric material; and
 wherein said step (j) removes said photoresist and said thin layer of conducting material from said dielectric material.

6. The method as set forth in claim 5, wherein said step (i) of etching said second pattern is performed by plasma etching.

* * * * *